United States Patent [19]
Shappir

[11] 4,267,632
[45] May 19, 1981

[54] PROCESS FOR FABRICATING A HIGH DENSITY ELECTRICALLY PROGRAMMABLE MEMORY ARRAY

[75] Inventor: Joseph Shappir, Saratoga, Calif.

[73] Assignee: Intel Corporation, Santa Clara, Calif.

[21] Appl. No.: 86,273

[22] Filed: Oct. 19, 1979

[51] Int. Cl.³ .......................................... H01L 21/28
[52] U.S. Cl. ...................................... 29/571; 148/1.5; 148/187; 357/23; 357/91
[58] Field of Search ................... 29/571; 148/1.5, 187; 357/23, 91

[56] References Cited

U.S. PATENT DOCUMENTS

| | | | |
|---|---|---|---|
| 3,996,657 | 12/1976 | Simko et al. | 29/571 |
| 4,033,026 | 7/1977 | Pashley | 29/571 |
| 4,095,251 | 6/1978 | Dennard et al. | 357/23 |
| 4,114,255 | 9/1978 | Salsbury et al. | 29/578 X |
| 4,142,926 | 3/1979 | Morgan | 29/578 X |
| 4,151,021 | 4/1979 | McElroy | 148/187 |
| 4,178,674 | 12/1979 | Liu et al. | 29/571 |

Primary Examiner—G. Ozaki
Attorney, Agent, or Firm—Blakely, Sokoloff, Taylor & Zafman

[57] ABSTRACT

A process for fabricating an MOS electrically programmable memory array which includes a plurality of floating gate memory devices is disclosed. The process employs two layers of polysilicon, each of which are used to define a plurality of spaced-apart parallel lines with the lines of the other layer. Doped bit line regions are formed in the substrate in alignment with the first lines prior to the fabrication of the second lines. The first lines are etched in alignment with the second lines to define floating gates. Overlying metal lines (bit lines) are formed over the doped regions and coupled to the doped regions through periodic contacts. Substantially fewer contacts are required than in prior art arrays, permitting the fabrication of a higher density array.

11 Claims, 11 Drawing Figures

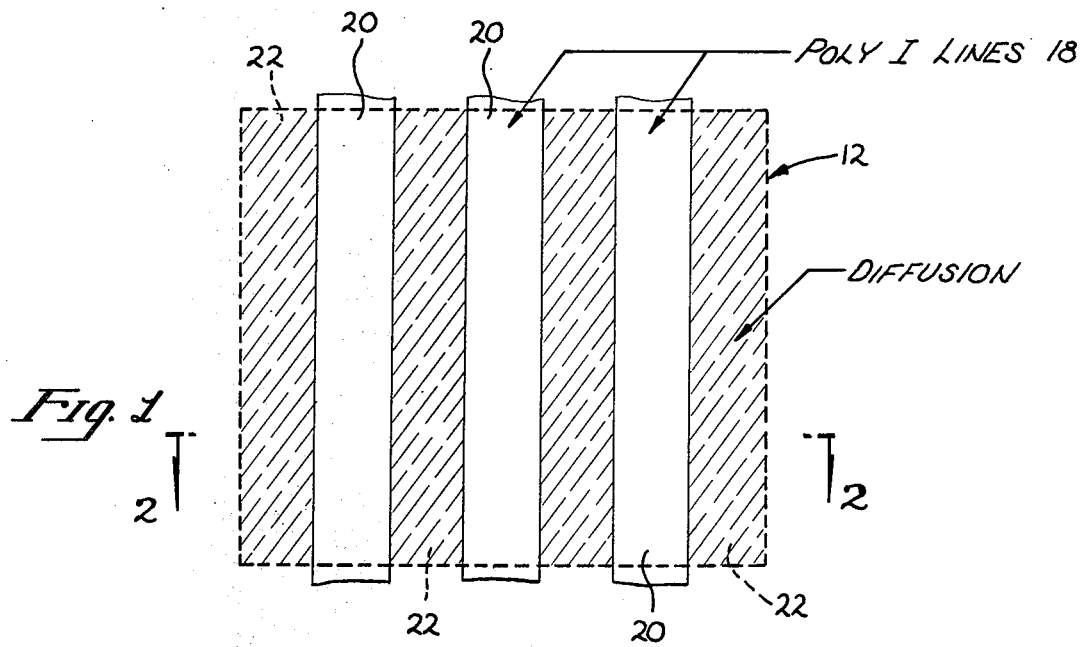
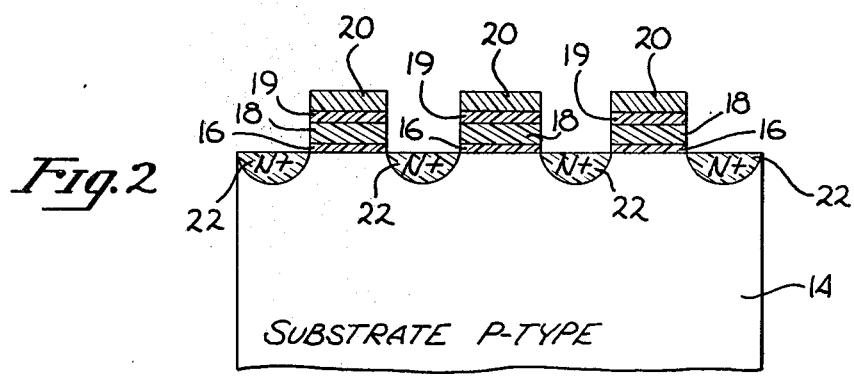
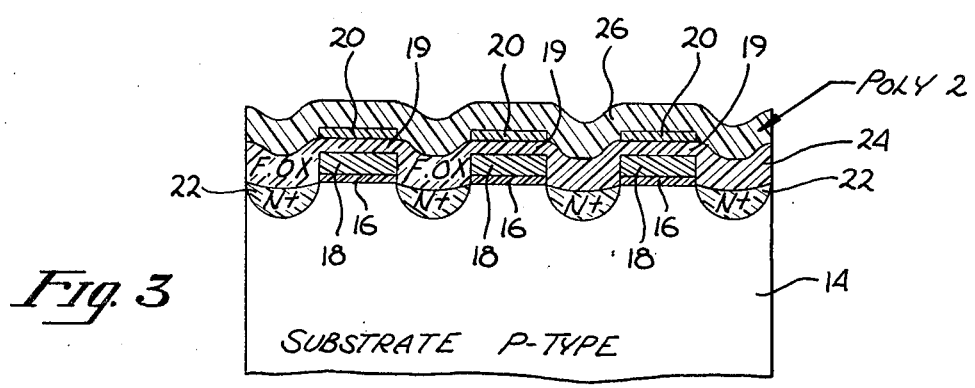

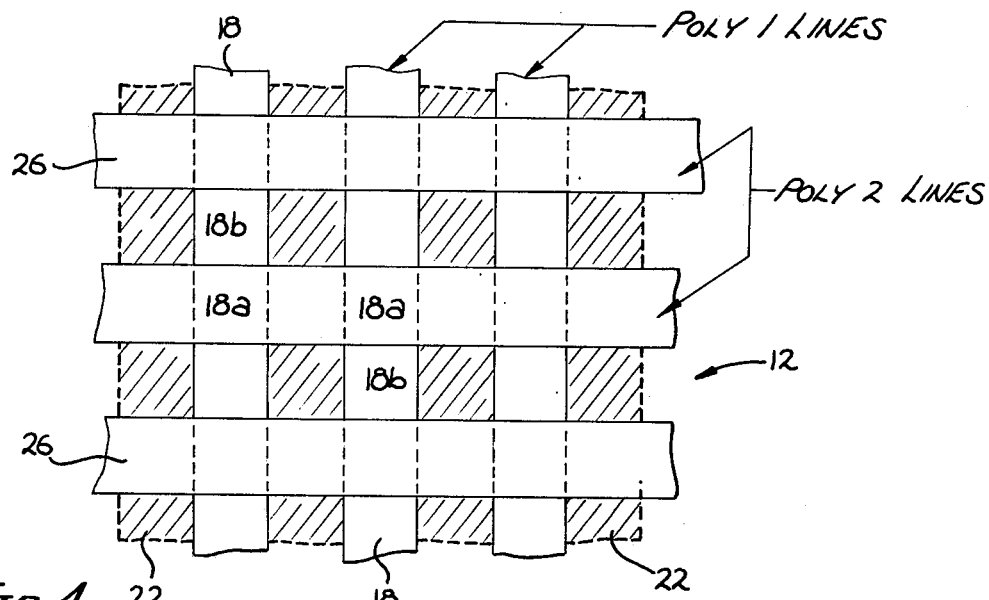
_Fig. 4_
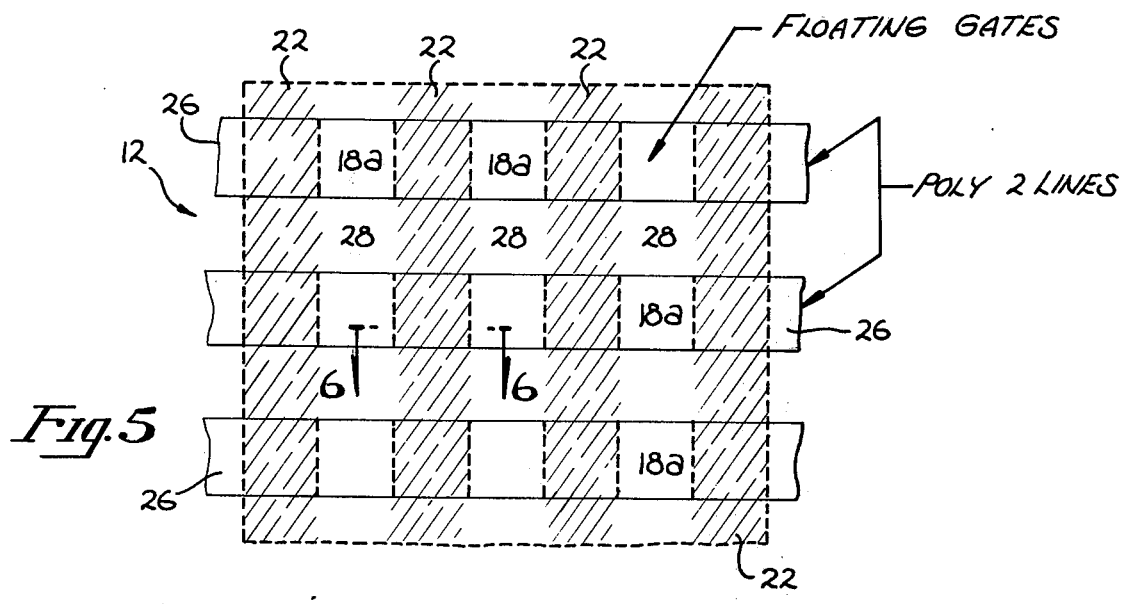
_Fig. 5_

PROCESS FOR FABRICATING A HIGH DENSITY ELECTRICALLY PROGRAMMABLE MEMORY ARRAY

BACKGROUND OF THE INVENTION

1. Field of the Invention

The invention relates to the field of MOS electrically programmable read-only memories (EPROMs).

2. Prior Art

Numerous electrically programmable read-only memories (EPROMs) are commercially available. In many cases, these memories employ floating gate memory devices; the floating gates of which are charged from the substrate through avalanche injection or channel injection. In general, these memory arrays are erased by exposing them to ultraviolet radiation. Examples of floating gate memory cells and memories are described in U.S. Pat. Nos. 3,996,657; 4,094,012; 4,114,255; and 4,142,926.

In a typical layout of these floating gate memory devices or cells, the cells are arranged in pairs. Each cell pair is connected to an overlying metal line through a metal contact. Thus, one-half contact per cell is required. These contacts require a relatively large amount of substrate area and thus are one limitation on the fabrication of higher density arrays. Moreover, these metal contacts decrease the production yields of the memories since they are generally more difficult to fabricate than other semiconductor elements in the array. As will be seen, the present invention eliminates most of these metal contacts, and by way of example, employs one metal contact per sixteen cells.

Some of the initial steps used in the presently described process are similar to the initial steps used in the fabrication of a mask programmed read-only memory as described in co-pending application, Ser. No. 907,557, filed May 19, 1978 and entitled "MOS DOUBLE POLYSILICON READ-ONLY MEMORY AND CELL", assigned to the assignee of the present application. Other related mask programmed read-only memory structures are described in U.S. Pat. No. 4,095,251.

SUMMARY OF THE INVENTION

A process is described for fabricating an MOS electrically programmable memory array on a substrate. A first plurality of parallel, spaced-apart, polysilicon lines are defined, insulated from the substrate. Doped regions are then formed between these first lines in alignment with these lines. A second plurality of parallel, spaced-apart, polysilicon lines which are insulated from the first lines and the doped regions are fabricated overlying the first lines and doped regions. The second lines are generally transverse to the first lines. The first lines are etched in alignment with the second lines so as to form a plurality of floating gates from the first lines. Each of these floating gates are disposed between a pair of the elongated doped regions and below one of the second lines. In this manner, a plurality of electrically programmable, floating gate devices are formed in a high density memory array.

BRIEF DESCRIPTION OF THE DRAWINGS

FIG. 1 is a partial plan view of a substrate illustrating the initial steps of the invented process. This view illustrates a plurality of first polysilicon lines formed on the substrate.

FIG. 2 is a cross-sectional elevation view of the substrate and lines of FIG. 1 taken generally through section line 2—2 of FIG. 1.

FIG. 3 illustrates the substrate of FIG. 2 after second polysilicon lines are formed on the substrate.

FIG. 4 is a plan view of the substrate of FIG. 3.

FIG. 5 is a plan view illustrating the partially completed array of FIG. 4 after etching steps used to define the floating gates.

DETAILED DESCRIPTION OF THE INVENTION

A process for fabricating an integrated circuit metal-oxide-semiconductor (MOS), electrically programmable read-only memory (EPROM) is decribed. In the following description of the currently preferred process, numerous specific details are set forth such as specific layer thicknesses, etc. It will be obvious to one skilled in the art, that the invented process may be practiced without these specific details. In other instances well known processing steps have not been described such as cleaning, masking, the formation of protective layers, etc., in order not to obscure the present invention in unnecessary detail.

Figure 11:
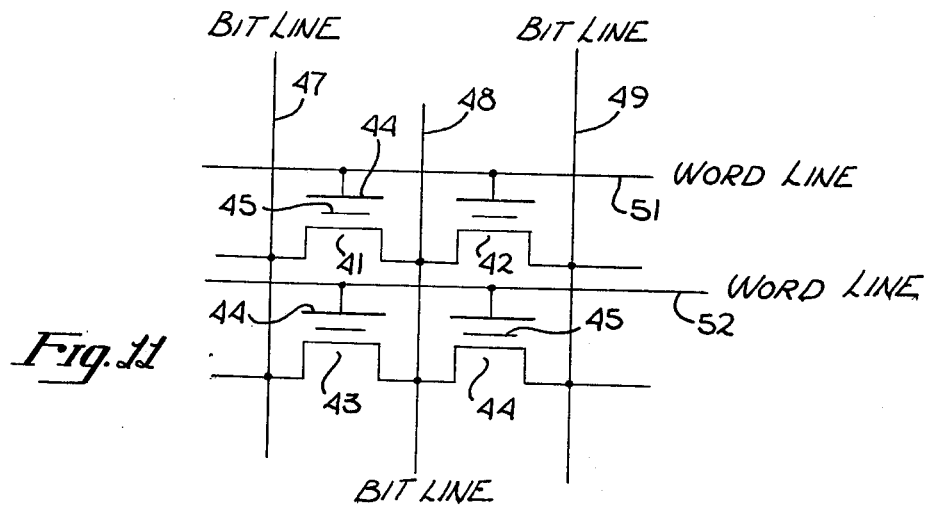
FIG. 11 is an electrical schematic of a portion of the array fabricated with the present invention.

Before describing the invented process, it will be helpful for an understanding of the process to review the resultant array in an electrical schematic form. Referring to FIG. 11, the process provides a plurality of floating gate memory devices or cells such as devices 41, 42, 43 and 44. Each of these devices includes a pair of spaced-apart doped regions in the substrate which are shared with other devices. Disposed between these doped regions over the channel region is a floating gate 45. These gates receive charge from the substrate during programming as is well-known. Control gates 44 are disposed above the floating gates. The control gates are used during reading or sensing and are also used for programming as is well-known. The operation and characteristics of the floating gate devices are substantially the same as described in the above-mentioned patents.

With the described process the floating gates of all the devices are formed from first polysilicon lines which are parallel to the bit lines. The doped regions for the devices are formed in general alignment with these first lines. The word lines such as lines 51 and 52 are fabricated from a second layer of polysilicon. Overlying metal lines disposed over the doped regions (and in contact with the doped regions, as will be described) form the bit lines for the array.

By way of example, to sense or program device 41 appropriate signals, as is well-known, are placed on line 51. Sensing or reading is performed on bit lines 47 and 48 for devices 41 (and for device 43). The programming potentials are also placed on these lines when programming. A plurality of cells may be simultaneously read as is commonly done.

To fabricate an entire memory on the same substrate employing the described high density memory array sense amplifiers are fabricated, having a pitch approximately equal to the pitch of the bit lines. Similarly, decoders may be fabricated having a pitch equal to or substantially equal to the pitch of the word lines. The fact that the second layer of polysilicon can pass over diffused substrate regions enables the realization of peripheral circuits with lesser pitch. Well-known circuits and circuit technology may be employed to fabricate the peripheral circuits for the memory including the sense amplifiers, decoders, programming circuits, buffers, etc.

In the presently preferred process the devices are n-channel devices fabricated on a p-type silicon substrate doped to a level of approximately 50 ohm-cm. A portion of the substrate 14 is shown in FIG. 2.

For one preferred embodiment, no "front-end" field oxide is employed in the array. However, such field oxides may be employed in the peripheral circuits. Thus, the processing described in conjunction with FIGS. 1 and 2 may occur after other processing has occurred for the peripheral circuits, such as the growing of field oxides.

In the array (a portion of which is shown within the dotted line 12 of FIG. 1) an oxide ($SiO_2$) layer is first grown on the substrate followed by the forming of a polycrystalline silicon (polysilicon) layer over the oxide layer. Then a second oxide layer is formed over the polysilicon layer, followed by the formation of a silicon nitride layer over the second oxide layer. Through well-known masking and etching steps, a plurality of lines (first polysilicon lines 18) are defined on the substrate. As is best seen in FIG. 2, each of the lines 18 is separated from the substrate by an oxide line 16. Each line 18 is covered by an oxide line 19 and a silicon nitride line 20. The oxide line 16 may be between 400 Å and 1000 Å thick, the polysilicon line 18 approximately 5000 Å thick, the oxide line 19 approximately 200 Å thick, and the silicon nitride line 20 approximately 400 Å thick. In general, first a masking step is used to mask the silicon nitride layer 20 to define the silicon nitride lines 20 and then through etching steps the lines 19 and 18. Line 16 is also etched where a diffusion step (as opposed to ion implantation) is used to define regions 22.

Once the polysilicon lines 18 are defined, elongated doped regions 22 are formed in the substrate in alignment with the lines 18. A phosphorus or arsenic dopant may be employed. An ordinary diffusion or ion implantation or a combination of these steps may be used. A dopant level of 20–30 ohms/square is preferred. The resultant structure is shown in FIGS. 1 and 2.

Next, an oxide layer 24 is grown over the array as shown in FIG. 3. The oxide does not grow beneath the silicon nitride member 20 thus this oxide covers the doped regions 22 and the side walls of the first polysilicon lines but not the silicon nitride lines 20.

With some processes it may be desirable to remove and replace the oxide lines 19 and the silicon nitride lines 20 before depositing a second layer of polysilicon. The reason for doing this in some cases is that the integrity of the oxide lines 19 and silicon nitride lines 20 may deteriorate during the preceding processing steps. (The oxide and silicon nitride are used as a diaelectric in the floating gate devices).

Now a second layer of polysilicon is deposited on the array; again this layer may be approximately 6000 Å thick. With an ordinary masking and etching step a plurality of parallel, spaced-apart, polysilicon lines 26 are formed (second polysilicon lines). These lines as seen in FIG. 4 are generally perpendicular to the lines 18 and are above and insulated from the doped regions 22 and lines 18. The lines 26 are insulated from the doped regions by the oxide layer 24 and from the lines 18 by the oxide lines 19 and silicon nitride lines 20.

Next the exposed silicon nitride and underlying oxide covering the lines 18 is removed by etching. It should be noted that the oxide and silicon nitride over the lines 18 and below the lines 26 remains in place because the lines 26 prevent the etchant from reaching these regions.

Now the lines 18 are etched in alignment with the lines 26. This removes the segments 18b of the lines 18 shown in FIG. 4 since these segments are not protected by the lines 26. (An oxide layer is sometimes present over the lines 26 to prevent the etchant from attacking these lines. This oxide layer may be the same oxide layer used in the masking and etching steps when forming the lines 26.) In the presently preferred embodiment, a self-aligning etching process is used to assure that the segments 18a of the lines 18 are in alignment with the edges of the lines 26. This etching process is described in U.S. Pat. No. 4,142,926.

Figure 6:
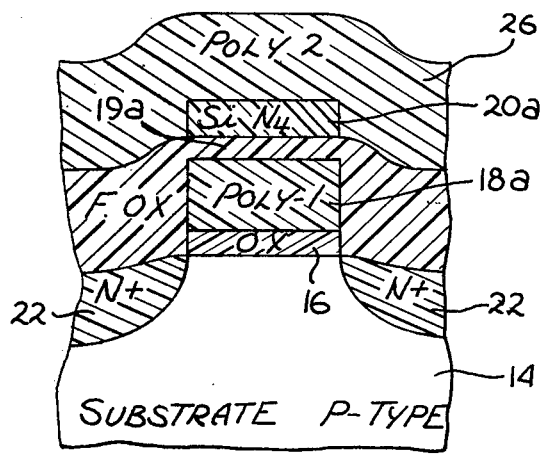
FIG. 6 is a partial cross-sectional elevation view of the substrate of FIG. 5 taken generally through section lines 6—6 of FIG. 5.

Referring to FIG. 5 the resultant structure now includes the lines 26 with the line segments 18a formed from the lines 18 disposed beneath these lines between the diffused regions 22. The line segments 18a form the floating gates for the memory devices. As may be best seen in FIG. 6, the resultant structure includes the overlying lines 26 insulated from the floating gate 18a by the silicon nitride member 20a (formed from the line 20) and the oxide member 19a (formed from the oxide line 19). The oxide layer 16 separates the floating gate 18a from the channel defined between the elongated regions 22. The device illustrated in FIG. 6 is a floating gate memory device corresponding to the devices 41, 42, 43 and 44 of FIG. 11.

Figure 8:
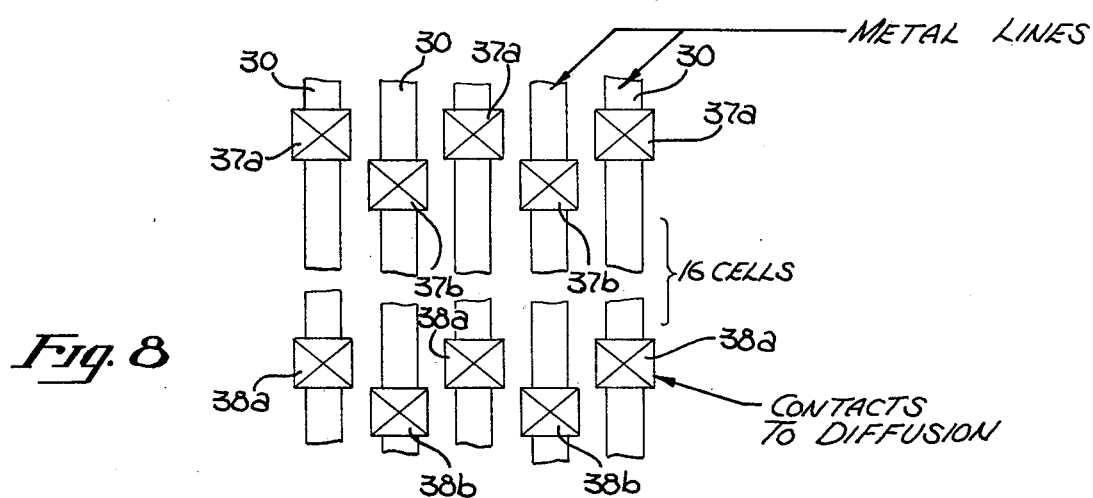
FIG. 8 is a plan view of a portion of an array fabricated with the present invention and in particular illustrates the metal word lines and the staggered contacts used to interconnect these lines with the doped regions.

Now metal lines (or other conductive lines) are formed over the regions 22. In the presently preferred embodiment the aluminum lines 30 are fabricated with well-known steps over the regions 22. Periodically, along the lines 30, contacts are formed as shown in FIG. 8 from the lines 30 to the underlying substrate regions 22. These contacts as will be described later may be metal contacts or "buried" contacts spaced periodically along the lines 30, between groups of cells, (e.g., between every 16 lines 26).

Figure 7:
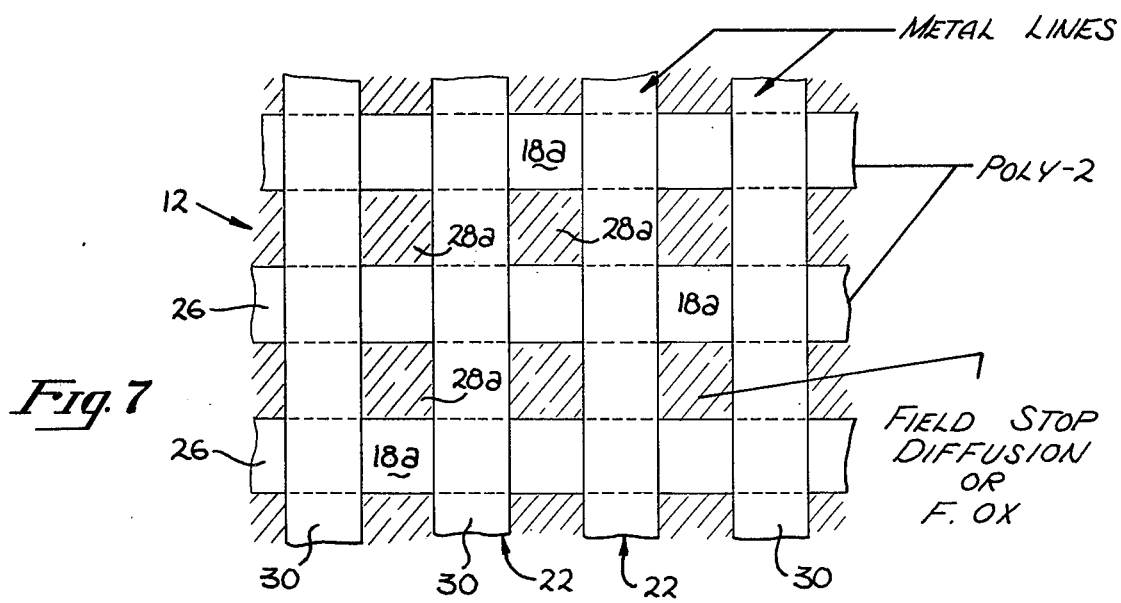
FIG. 7 illustrates the array of FIG. 5 after metal lines are formed over the doped regions.

The substrate regions below the removed line segments 18b shown as regions 28a in FIG. 7 are of the same conductivity type and resistivity as the substrate. Punch through between the regions 22 can occur at the regions 28a, particularly when the higher programming potentials are used. For this reason, the entire array is subjected to a boron implant to implant the regions 28a. This implantation defines field stops between the regions 22 except of course in the channel region of the memory devices. An implant to a level of $1-3\times10^{12}$ atoms/cm$^2$ is believed to be sufficient. Alternatively, the regions 28a may be field oxide regions. For this alternate embodiment the field oxide regions are formed prior to defining the lines 18 of FIG. 1. These field oxide regions may be formed, for example, during the "front-end" steps when other field oxide regions are defined in the peripheral circuits. These field oxide regions (as opposed to the boron implant) provide better punch through characteristics, however, more area is required when these field oxide regions are used primarily because of the "bird-beak" problem and misalignments between successive processing steps.

Referring now to FIG. 8, a portion of the array is again shown, however, without the lines 26 for sake of simplicity. As mentioned, after the aluminum lines 30 are defined, periodically along these lines contacts are formed. These contacts extend down to the underlying regions 22. These contacts, along with a metal lines 30, improve the conductivity along the doped regions 22. The contacts with current technology are somewhat larger than the pitch of the lines 26 and 30, and thus, cannot be placed in alignment. For this reason, the contacts are staggered. For example, the contacts 37a are on one horizontal line while the contacts 37b are on another. Similarly, the contacts 38a are on one horizontal line while the contacts 38b are on another. As mentioned, the contacts 37 and 38 may be separated by a group of cells, for example, 16 cells that is 16 lines 26 would be disposed between the contacts 37 and 38. In the regions of the contacts, cells are not fabricated and thus the lines 26 are not present. Ordinary metal contacts may be used for the contacts 37 and 38.

Figure 9:
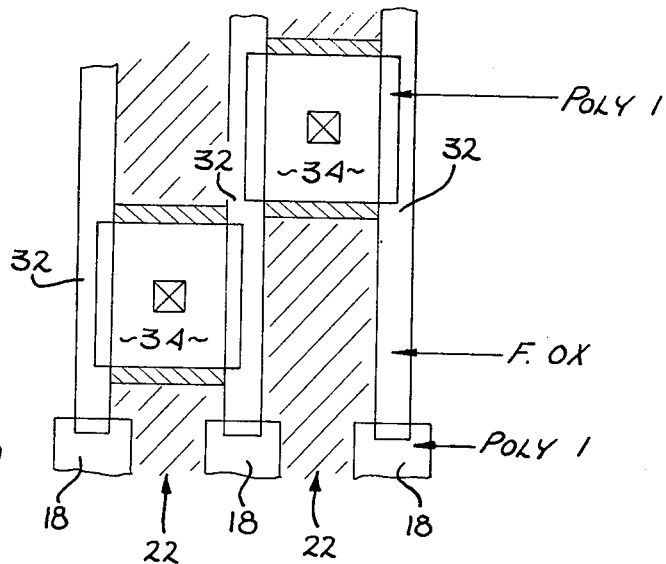
FIG. 9 is a plan view used to describe the presently preferred embodiment of the staggered contacts of FIG. 8.

In the presently preferred embodiment, rather than using direct metal contacts, buried contacts are used with the metal lines contacting pads formed from the first layer of polysilicon. A method for fabricating these contacts including a discussion of the formation of field oxide regions is found in U.S. Pat. No. 4,033,026. Referring to FIG. 9 during the "front-end" processing of the memory, field oxide regions 32 are formed in the regions of the staggered contacts. As shown, these regions are adjacent to the lines 18 formed later from the first polysilicon layer. The first polysilicon layer is also used to define the contacts 34 which are in direct contact with the substrate (or a doped region in the substrate). Metal contacts are then used which extend from the metal lines to the polysilicon contacts 34. In this manner, it is not necessary to have metal contacts which extend from the metal line to the substrate. Again, as was the case in FIG. 8, the contacts are staggered.

It is also possible to stagger the contacts with other layouts. For example, the contacts 37b could be spaced-apart from the contacts 37a with 8 rows of cells between the contacts 37a and 37b. With this arrangement the contacts 38b would be spaced-apart from the contacts 38a by 8 rows of cells. Thus a line of contacts would occur between every 8 rows of cells in the array, however, each line of contacts would extend from alternate ones of the metal lines.

Figure 10:
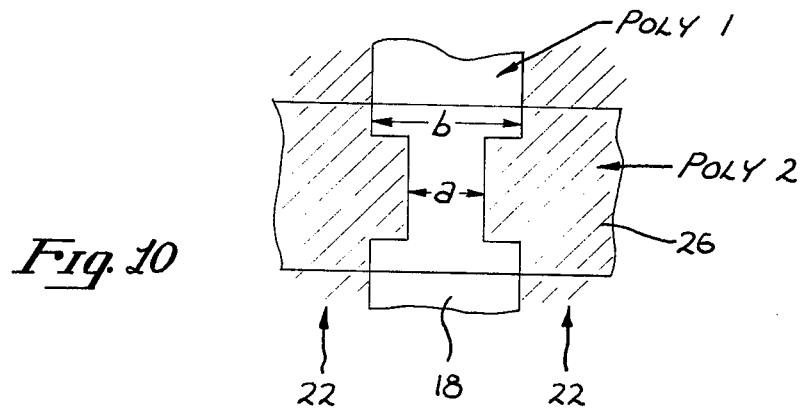
FIG. 10 is a plan view of the intersection of one of the first and second polysilicon lines. This view is used to illustrate the width of the channel regions.

In FIG. 10 a layout for the lines 18 is illustrated which enhances the performance of the memory devices and improves the punch-through characteristics through the regions 22. The lines 18 are somewhat narrower in the channel regions of the devices, that is, under the lines 26. This is shown by dimension "a". The remainder of the lines 18 primarily between the lines 26 is somewhat wider as shown by dimension "b". The dimension "a", since it is somewhat narrower, enhances the programming of the floating gates because of the narrow channel. On the other hand, the greater distance between the regions 22 (where no active devices are present) increases the punch-through potential. For typical current processing technology "a" may range between $2.5\mu$ to $4.0\mu$ and "b" between $4.0\mu$ to $6.0\mu$.

In the typical commercial fabrication of EPROM cells where one-half contact per cell is used, a substrate area of approximately $(180 \text{ mil})^2$ is required for a 64K EPROM. By employing somewhat more stringent design rules these cells may be reduced to approximately $(142 \text{ mil})^2$. Cells fabricated with the invented process without the implanted field stops require approximately $9\mu \times 9\mu$ of substrate area which corresponds to a die size of approximately $(126 \text{ mil})^2$. This area may be reduced to approximately $(119 \text{ mil})^2$ with current technology depending upon the masking, etching, etc. techniques which are used. Where the field oxide isolation is used between the cells, with current technology, the die areas will range between $(126 \text{ mil})^2$ to $(144 \text{ mil})^2$ for a 64K EPROM. Thus, by employing the presently disclosed process, substantially less array area is required, even when taking into account the periodic contacts, along the metal lines, such as contacts 37 and 38 of FIG. 8. This reduction in array area is obtained primarily because of the reduction in the number of contacts in the array.

While in the presently preferred embodiment as best seen in FIG. 6 both the oxide member 19a and silicon nitride member 20a are used to separate the line 26 from the floating gate 18a, both these members may not be necessary depending upon the process employed, etc. For example, a thicker oxide member 19a may be employed alone or only a silicon nitride member may be used.

As will be appreciated, while only the fabrication of a few cells have been shown in the drawings, as is typically the case a large array of cells is simultaneously fabricated. Moreover, during the fabrication of the array of cells, other photolithic fabrication, primarily in the peripheral circuits, may occur simultaneously. For example, when the lines 18 are defined from the first layer of polysilicon, gates for field-effect transistors may be simultaneously formed in the peripheral circuits. A masking step and related steps will enable a thick oxide to be grown on the first polysilicon elements in the peripheral circuits at the same time that the thick oxide is grown over the doped substrate regions in the array. Thus, when the first polysilicon layer is etched in the array (following the etching of the second polysilicon layer) the first layer polysilicon elements in the peripheral circuits are not attacked. The second polysilicon layer in the peripheral circuits may be used for additional interconnections.

Thus, a process has been described for fabricating a high density electrically programmable read-only memory array. The number of contacts employed in the array when compared to prior art is greatly reduced, thereby permitting higher densities in addition to better yields. Unlike other prior art processes for forming floating gate devices, second polysilicon lines cross the doped regions in the substrate which facilitates a denser layout.

I claim:

1. A process for fabricating a metal-oxide-semiconductor, electrically programmable memory array on a substrate, comprising the steps of:

forming a first plurality of parallel, spaced-apart, polysilicon lines insulated from said substrate;

doping elongated regions in said substrate between said first lines, in alignment with said first lines;

forming a second plurality of parallel, spaced apart, polysilicon lines insulated from said first lines and said doped regions, said second lines generally transverse to said first lines and overlying said first lines and doped regions; and etching said first lines in alignment with said second polysilicon lines so as to form a plurality of floating gates from said first lines, each of said floating gates being disposed between a pair of said doped regions and being insulated from, and disposed below, one of said second lines;

whereby a plurality of electrically programmable floating gate memory devices are formed in a high-density memory array.

2. The process defined by claim 1 including the forming of a third plurality of conductive lines parallel to, and above each of said doped regions, with contacts between said third lines and their respective underlying doped regions, said contacts being formed between groups of said second lines.

3. The process defined by claim 2 wherein said first lines are formed with an overlying silicon nitride line.

4. The process defined by claim 2 including the step of forming isolation regions in said substrate in the regions bordered by said floating gates on first opposite sides and said third lines on second opposite sides.

5. The process defined by claim 4 wherein said isolation regions are formed by ion implantation.

6. The process defined by claim 2 including the formation of field oxide isolation regions bordered by said floating gates on first opposite sides and said third lines on second opposite sides.

7. A process for fabricating a metal-oxide-semiconductor, electrically programmable memory array on a p-type silicon substrate comprising the steps of:

forming a first plurality of parallel, spaced-apart, polysilicon lines insulated from said substrate by an oxide layer;

doping elongated regions in said substrate between said first lines with an n-type dopant, in alignment with said first lines;

forming an oxide layer over said elongated doped lines;

forming a second plurality of parallel, spaced-apart, polysilicon lines insulated from said first lines and said doped regions, said second lines generally transverse to said first lines and overlying said first lines and doped regions;

etching said first lines in alignment with said second polysilicon lines so as to form a plurality of floating gates from said first lines, each of said floating gates being disposed between a pair of said doped regions and being insulated from, and disposed below, one of said second lines;

forming contacts to said doped region, said contacts being formed between groups of said second lines; and forming a third plurality of conductive lines parallel to, and above, each of said doped regions in contact with said contacts;

whereby a plurality of electrically programmable floating gate memory devices are formed in a high-density memory array.

8. The process defined by claim 7 wherein said contacts are staggered along lines generally parallel to said second lines.

9. The process defined by claim 7 wherein isolation regions are formed which are bordered by said floating gates on first opposite sides and said third lines on second opposite sides.

10. The process defined by claim 9 wherein said isolation regions are formed by ion implantation.

11. The process defined by claim 9 wherein said isolation regions are formed by a field oxidation step.

* * * * *